United States Patent [19]

Taneichi et al.

[11] Patent Number: 5,068,624
[45] Date of Patent: Nov. 26, 1991

[54] AMPLIFIER

[75] Inventors: Yoshio Taneichi; Yukinari Fujiwara, both of Tokyo, Japan

[73] Assignee: Hitachi Denshi Kabushiki Kaisha, Tokyo, Japan

[21] Appl. No.: 579,377

[22] Filed: Sep. 10, 1990

[30] Foreign Application Priority Data

Sep. 11, 1989 [JP] Japan .................................. 1-105360

[51] Int. Cl.$^5$ ............................................... H03F 1/34
[52] U.S. Cl. ...................................... 330/293; 330/88; 330/89; 330/149; 330/295; 307/296.1; 307/254; 307/264
[58] Field of Search .................. 330/293, 294, 295, 84, 330/88, 89, 149; 307/296.1, 254, 264

[56] References Cited

U.S. PATENT DOCUMENTS 3,075,153  1/1963  Dodd et al. ............................. 330/84
4,103,245  7/1978  Yokoyama ........................... 330/256

FOREIGN PATENT DOCUMENTS 56-76611  6/1981  Japan ................................... 330/149

Primary Examiner—Eugene R. LaRoche
Assistant Examiner—Tan Dinh
Attorney, Agent, or Firm—Blakely Sokoloff Taylor & Zafman

[57] ABSTRACT

In an amplifier using at least two transistors are amplifying elements, the bases (or gates) and the collectors (or drains) of the transistors are commonly connected. A first impedance element is connected between the bases (or gates) and the collectors (or drains). A second impedance element is connected between an emitter (or source) of each transistor and a ground. A third impedance element is connected between the emitters (or sources).

3 Claims, 3 Drawing Sheets

AMPLIFIER

BACKGROUND OF THE INVENTION

The present invention relates to an amplifier using a plurality of transistors and, more particularly, to a transistor amplifier for operating amplifying elements in parallel with each other.

FIG. 2 shows an example of a conventional technique of an amplifier using a transistor. Referring to FIG. 2, an emitter-grounded transistor 1 is used as an amplifying element, an impedance element 2 is connected between the base and collector of the transistor 1, and an impedance element 3 is connected between its emitter and the ground, thereby obtaining a required gain. In operation characteristic curves of this amplifier shown in FIG. 3, a point of intersection between an I/O linear curve Q and a cubic strain curve P, i.e., an intercept point R is determined by the characteristics of the transistor 1.

In order to obtain a higher intercept point in the above conventional technique, however, although a specific transistor must be selected as the transistor 1 or an optimal operation point must be selected, this cannot be easily realized.

SUMMARY OF THE INVENTION

The present invention has been made to solve the above conventional problem, and has as its object to improve an "intercept" point by about 3 dB without changing a transistor and an operation point.

In order to achieve the above object of the present invention, there is provided an amplifier using at least two transistors as amplifying elements, wherein first input electrodes and first output electrodes of the transistors are commonly connected, a first impedance element is connected between the first input electrodes and the first output electrodes, a second impedance element is connected between a second output electrode of each transistor and ground, and a third impedance element is connected between the second output electrodes.

In the present invention, therefore, about a ½ level of an input signal is supplied to the transistors, and the transistors are operated by this signal of about a ½ level in parallel with each other, thereby reducing an influence of a nonlinear strain to improve an "intercept" point.

DETAILED DESCRIPTION OF THE PREFERRED EMBODIMENT

An embodiment of the present invention will be described in detail below with reference to the accompanying drawings.

Figure 1:
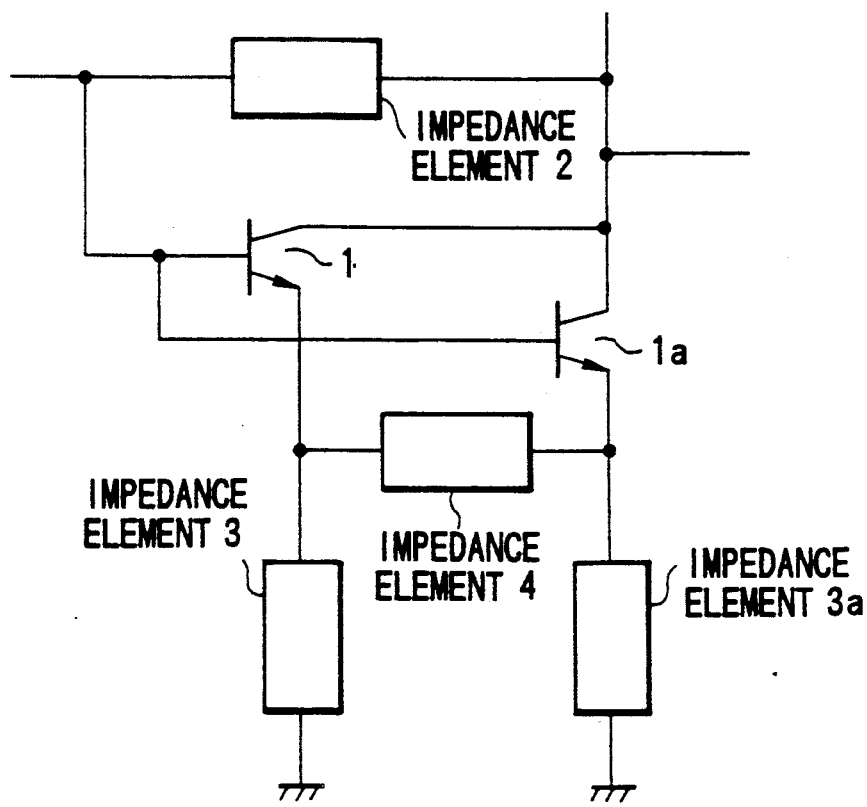
FIG. 1 is a block diagram showing a basic arrangement of an embodiment of the present invention.
Figure 2:
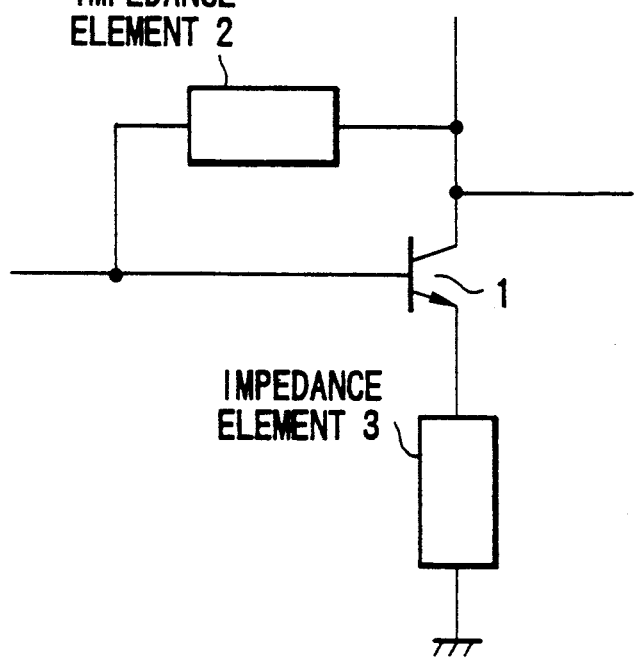
FIG. 2 is a block diagram showing an arrangement of a conventional amplifier.
Figure 3:
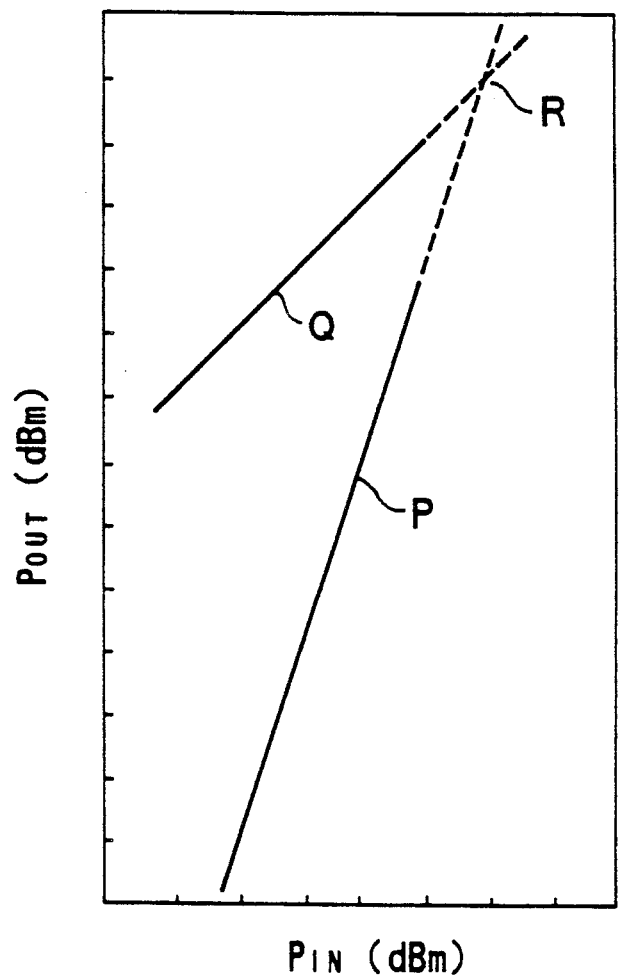
FIG. 3 is a graph showing operation characteristic curves of the amplifier shown in FIG. 2.

FIG. 1 shows a basic arrangement of an amplifier according to an embodiment of the present invention. As shown in FIG. 1, this embodiment uses two emitter-grounded transistors 1 and 1a as amplifying elements, and the bases and the collectors of the transistors 1 and 1a are commonly connected. An impedance element 2 constituted by a resistor and the like is connected between the bases and collectors. Impedance elements 3 and 3a are connected between the emitters of the transistors 1 and 1a and ground to obtain a required gain. In addition, an impedance element 4 constituted by a resistor is connected between the emitters to prevent an unstable operation such as oscillation. Note that in FIG. 1, the same reference numerals as in FIG. 2 denote the same or corresponding parts.

According to the amplifier having the above arrangement, about a ½ level of an input signal is supplied to the transistors 1 and 1a during an operation, and the transistors are operated by substantially the ½ level of the input signal, thereby obtaining a low strain and a high "intercept" point. In addition, since the impedance element 4 is inserted between the emitters of the transistors 1 and 1a, an unstable operation such as oscillation caused by variations in transistors 1 and 1a can be prevented by the impedance element 4.

Figure 4:
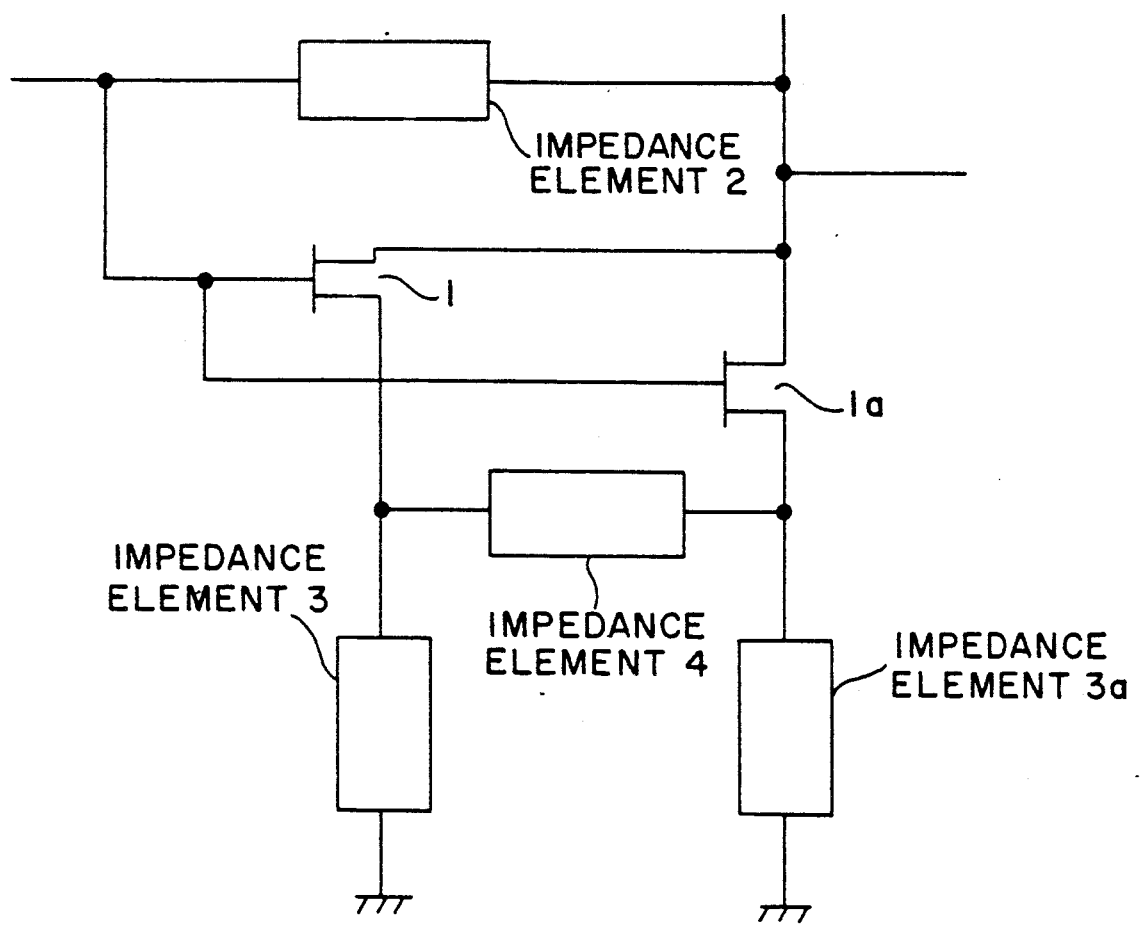
FIG. 4 is a block diagram showing a basic arrangement of a second embodiment of the present invention.

Although an npn transistor is used in the above embodiment, a pnp transistor may be used. In addition, an field-effect transistor (FET) can be used as shown in FIG. 4. In this case, by connecting the gate, source, and drain of an FET similarly to the base, emitter, and collector of an npn or pnp transistors, completely the same arrangement as described above can be obtained.

As has been described above, according to the present invention, an "intercept" point can be improved by only changing a circuit arrangement without using any specific transistor. As a result, an amplifier having a low strain can be realized.

What is claimed is:

1. An amplifier using at least two transistors as amplifying elements, wherein first input electrodes and first output electrodes of said transistors are commonly connected, a first impedance element is connected between said first input electrodes and said first output electrodes, a second impedance element is connected between a second output electrode of each transistor and ground, and a third impedance element is connected between said second output electrodes.

2. An amplifier according to claim 1, wherein said first input electrode is a base of a bipolar transistor, said first output electrode is a collector thereof, and said second output electrode is an emitter thereof.

3. An amplifier according to claim 1, wherein said first input electrode is a gate of a field effect transistor, said first output electrode is a drain thereof, and said second output electrode is a source thereof.

* * * * *